United States Patent [19]

Nakatsuka et al.

[11] Patent Number: 4,821,275
[45] Date of Patent: Apr. 11, 1989

[54] LASER DIODE

[75] Inventors: Shinichi Nakatsuka, Kokubunji; Naoki Chinone, Hachioji; Kazuhisa Uomi, Kokubunji; Yuichi Ono, Nishitama; Takashi Kajimura, Hishitama, all of Japan

[73] Assignee: Hitachi, Ltd., Tokyo, Japan

[21] Appl. No.: 140,755

[22] Filed: Jan. 4, 1988

Related U.S. Application Data

[63] Continuation of Ser. No. 760,916, Jul. 31, 1985, abandoned.

[30] Foreign Application Priority Data

Aug. 3, 1984 [JP] Japan .................. 59-162905

[51] Int. Cl.$^4$ .............................................. H01S 3/19
[52] U.S. Cl. ...................... 372/45; 372/46; 372/48
[58] Field of Search ............................ 372/45, 46, 48

[56] References Cited

U.S. PATENT DOCUMENTS 4,674,094 6/1987 Murakami .................. 372/45

Primary Examiner—William L. Sikes
Assistant Examiner—Georgia Y. Epps
Attorney, Agent, or Firm—Antonelli, Terry & Wands

[57] ABSTRACT

A stripe groove is formed on a semiconductor substrate and buried by lamination of multiple semiconductor layers, and a channel being lower than the substrate surface is formed outside the groove near at least one mirror edge, such that a laser diode with decreased astigmatism can be produced.

24 Claims, 2 Drawing Sheets

LASER DIODE

This is a continuation of application Ser. No. 760,916 filed July 31, 1985 now abandoned.

BACKGROUND OF THE INVENTION

The present invention relates to a laser diode which has excellent noise characteristics without astigmatism.

In so-called index guided type elements where laser light distribution (transverse mode) of a laser diode is confined by the refractive index step between a stripe inside portion and an outer edge portion, the lasing spectrum (longitudinal mode) becomes singular. When such an element is used for a compact disk, a feedback induced noise caused by reflected light from the disk surface may be produced. On the other hand, in an element with a smaller index step, although the longitudinal mode becomes a multi mode oscillation and the feedback induced noise is not produced, the position of the beam west is different in the horizontal direction to an active layer than in the vertical direction producing a so-called astigmatism and making focusing of the laser beam difficult. Consequently, an element in which the longitudinal mode is multi mode and in which there is no astigmatism is desirable. The above object can be attained if the refractive index is made smaller inside the element and the index step of the stripe is made larger at a portion near one edge by varying the stripe structure in the optical axis direction of the laser diode. An element in which the index step is made larger at a portion near one edge of the element has been reported in Shimada et al, "characteristics of rib guide type GaAlAs laser added edge mode filter", No. 31 Applied Physics lecture (Mar. 29–Apr. 2, 1982) (patent publication No. 5273/1979). However, this element has a structure different from a conventional structure in which semiconductor layers are grown on a channeled substrate. Consequently, control of the channel depth at a portion near the element edge is difficult during the manufacturing process. Furthermore, crystal growth must be performed twice, and the structure cannot be repeatedly produced with ease.

SUMMARY OF THE INVENTION

An object of the present invention is to provide a laser diode which has excellent noise characteristics without astigmatism and which is stable for use in a compact disk.

In order to attain the above object, a laser diode of the present invention is formed having a stripe groove on a semiconductor substrate and having many semiconductor layers including an active layer laminated to bury the groove, wherein a channel being disposed lower than the substrate surface is formed outside the groove near at least one mirror edge, with the thickness of a cladding layer and active layer contacting the substrate near the mirror edge decreased by using liquid phase epitaxy growth. In such a laser diode the index step is increased and any astigmatism is eliminated. The index step inside the element decreases according to the film thickness of the various layers and the longitudinal mode becomes multi mode so that feedback induced noise is not produced.

DESCRIPTION OF THE PREFERRED EMBODIMENTS

Embodiments of the invention will now be described referring to the accompanying drawings.

Figure 1A:
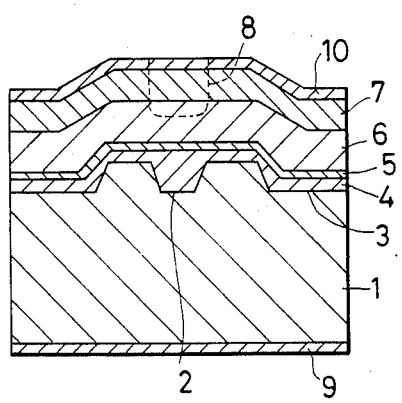
FIG. 1(a) is a sectional view of a laser diode of one embodiment of the present invention at a region near a mirror edge.
Figure 1B:
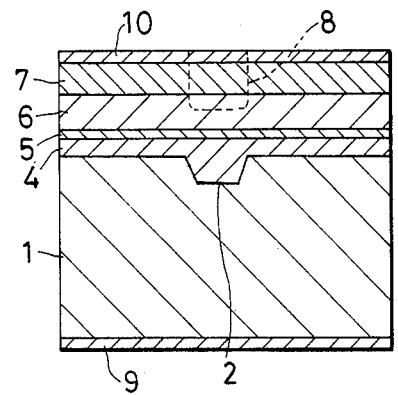
FIG. 1(b) is a sectional view of the laser diode at the a center portion.
Figure 2:
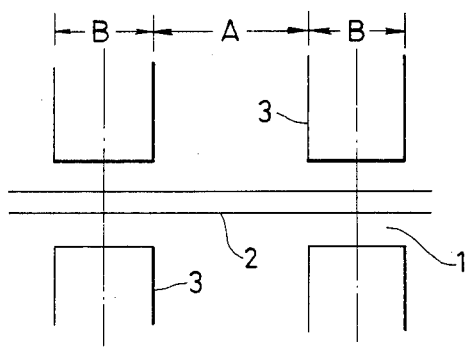
FIG. 2 is a plan view of a groove and a channel formed on a substrate of the embodiment of FIGS. 1(a) and 1(b)
Figure 3A:
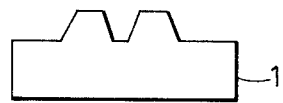
FIG. 3(a) is a side view of the substrate.
Figure 3B:
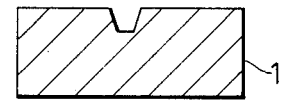
FIG. 3(b) is a sectional view of the center portion of the substrate.
Figure 4:
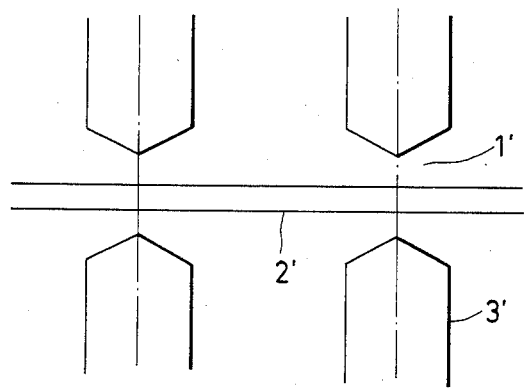
FIG. 4 is a plan view of a substrate as of another embodiment of the present invention.
Figure 5:
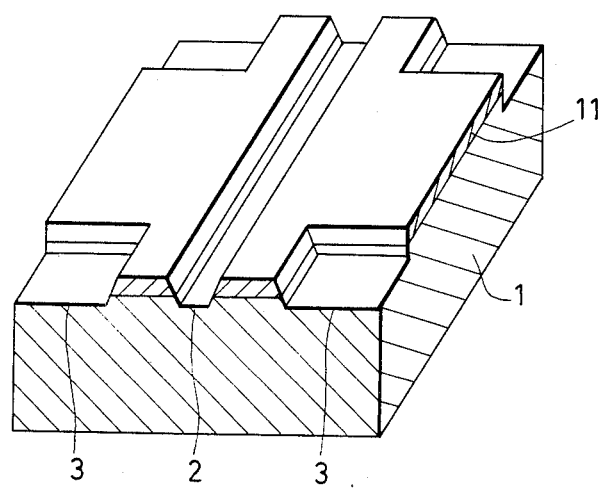
FIG. 5 is a perspective view illustrating still another embodiment of the invention.

FIG. 1 shows a laser diode of one embodiment of the present invention. FIG. 1(a) is a sectional view of the laser diode at a portion near a mirror edge, and FIG. 1(b) is a sectional view thereof at a center portion. FIG. 2 shows a groove and a channel formed on a substrate of the embodiment of FIGS. 1(a) and 1(b). FIG. 3(a) is an end elevation of the substrate, and FIG. 3(b) is a sectional view of the center portion of the substrate. FIG. 4 is a plan view of a substrate of another embodiment of the present invention. FIG. 5 is a perspective view illustrating still another embodiment of the present invention.

FIG. 2 is a plan view illustrating the structure of a substrate according to the present invention. In FIG. 2, chemical etching is performed using an $SiO_2$ mask formed on n-type GaAs substrate 1 by conventional photo lithograph technology. In region A of FIG. 2, a groove 2 of width 2–4 $\mu$m is formed. In region B, the groove 2 of width 2–4 $\mu$m continues and a channel 3 is formed at positions separated from the groove 2 by 1–3 $\mu$m. The depth of the groove 2 and the channel 3 is 1–4 $\mu$m from the surface of the substrate 1. As shown in FIG. 1, n-type GaAlAs cladding layer 4, undoped GaAlAs active layer 5, p-type GaAlAs cladding layer 6 and n-type GaAs capping layer 7 are grown in sequence. Next, using an $Si_3N_4$ film as a mask, selective diffusion of Zn is performed on the n-type GaAs capping layer 7 above the groove 2 to form diffused region 8. Then AuGeNi/Cr/Au electrode 9 and Cr/Au electrode 10 are evaporated. Peeling is performed at portions shown by dash-and-dot lines of FIG. 2 forming a reflecting surface. FIG. 1(a) shows a sectional view at a region near the mirror edge, and the groove 2 and the channel 3 have a rapid crystal growth rate according to the growth habit of liquid phase epitaxy. Consequently, film thickness of crystals formed in convex portions interposed between the groove and the channel becomes relatively thin. The film thickness of the n-type GaAlAs cladding layer 4 and the active layer 5 formed on the center groove 2 in FIG. 1(a) is thinner than at the element center portion shown in FIG. 1(b), producing a large index step at the inside such that outside of the stripe and the laser ray is confined and the astigmatism of the outgoing ray becomes small. In order to obtain the large index step, the light absorption of the n-type GaAs substrate 1 must be made larger and therefore in the area outside of the groove near the channel region, the thickness of the n-type cladding layer 4 must be 0.3 μm or less and the thickness of the active layer 5 must be 0.07 μm or less. On the other hand, in the element center portion as shown in FIG. 1(b), both the n-type GaAlAs cladding layer 4 and the active layer 5 are thick and therefore the index step becomes small and a multi mode is produced such that feedback induced noise is not produced. In order to make the diffractive index small, influence of the n-type GaAs substrate 1 must be made small and therefore in the area outside of the groove the thickness of the n-type cladding layer 4 must be 0.3 μm or more and thickness of the active layer 5 be made 0.07 μm or more. If the former is less than 0.7 μm and the latter is less than 0.1 μm, the multi mode with self pulsation is produced and the noise is further reduced. Thickness of other layers is specified so that the p-type cladding layer 6 is 0.8–2.0 μm, and the n-type capping layer 7 is 0.5–5.0 μm. The Al-As composition of various layers is specified so that each of the layers 4, 6 is 35–55% and the layer 5 is 5–20%.

In the element, the longitudinal mode is multi mode and the relative noise intensity is $1 \times 10$ Hz$^{-1}$ or less irrespective of the feedback light quantity. The astigmatism is 5 μm or less.

FIG. 4 shows another embodiment of the invention. FIG. 4 is a plan view of a substrate of this embodiment, at a portion near a mirror edge in a peeling position shown by the dash-and-dot line of FIG. 4. The distance between a groove 2' and a channel 3' becomes larger at a remote position from the mirror edge. A substrate 1' provided with the groove 2' and the channel 3' as shown in FIG. 4 is used, and the crystal growth is performed in similar manner to the first embodiment. In this structure, since the distance between the groove 2' and the channel 3' varies gradually, variation of the n-type cladding layer from thick region to thin region is produced smoothly and therefore the light scattering in the boundary between the two regions becomes small in comparison to the first embodiment and the threshold current also becomes small.

A still further embodiment of the invention, is shown in FIG. 5, in which crystal growth of a p-type GaAs layer of about 1 μm is performed on an n-type GaAs layer by a MOCVD method so as to form a substrate. This substrate is used and the crystal structure is grown in a similar manner to the previous embodiment. That is, etching is performed on p-type GaAs layer 11 formed on n-type GaAs layer 1 to form a groove 2 and a channel 3 in similar manner to the previous embodiment. Next an n-type cladding layer 4, an active layer 5, p-type cladding layer 6 and a capping layer 7 are laminated in sequence. Next, selective diffusion of Zn is performed. In this structure, since the current stricture is performed twice at the p-type GaAs layer 11 and the n-type GaAs capping layer 7, the mark alignment for the Zn diffusion to the n-type GaAs capping layer 7 becomes easy.

Although the above embodiments have been described in materials from the GaAlAs/GaAs series, similar effects may be expected in other series, for example, the InGaP/InP series or the InGaP/GaAs series. Furthermore, similar effects are achieved even if p type and n type are reversed or whether the active layer is p type or n type.

In a laser diode of the present invention, a stripe groove is formed on a semiconductor substrate and many semiconductor layers including an active layer are laminated to bury the groove, a channel being lower than the substrate surface is formed outside the groove near at least one mirror edge, the thickness of a cladding layer the active layer contacting the substrate near the mirror edge is decreased by using liquid phase epitaxy growth, distance between the active layer and the substrate is decreased such that the index step is increased and any astigmatism is eliminated, and the index step inside the groove and outside the groove is decreased within the element such that the longitudinal mode becomes multi mode and the feedback induced noise is not produced. Thus a lens for astigmatism correction becomes unnecessary, and a laser diode being suitable as a light source for a video disk or a compact disk can be obtained.

What is claimed is:

1. A semiconductor laser diode comprising:
   a semiconductor substrate having mirror edges;
   a stripe groove formed in said substrate and running substantially perpendicular to said mirror edges, having end portions and a center portion between said end portions;
   channel regions separated from said stripe groove and formed in said substrate adjacent said mirror edges and only at portions of said substrate corresponding to said end portions of said stripe groove;
   multiple semiconductor layers including a first cladding layer formed on said substrate, and an active layer formed on said first cladding layer, such that said stripe groove and said channel regions are buried;
   wherein said first cladding layer includes a first part adjacent said end portions of said stripe groove having a thickness less than that of a second part adjacent said center portion of said stripe groove, and said active layer includes a first part adjacent said end portions of said stripe groove having a thickness less than that of a second part adjacent said center portion of said strip groove;
   further wherein the distance between said stripe groove and said channel regions increases from a point at which said channel regions are closest to said mirror edges to a point at which said channel regions are most remote from said mirror edges; and
   electrodes formed on a back surface of said substrate and on an uppermost semiconductor layer.

2. A semiconductor laser diode according to claim 1, wherein said semiconductor layers further include:
   a second cladding layer formed on said active layer; and
   a capping layer formed on said second cladding layer.

3. A semiconductor laser diode according to claim 1, wherein said substrate is at least one of GaAs or GaAlAs.

4. A semiconductor laser diode according to claim 2, wherein said first cladding layer is n-type GaAlAs;
   said active layer is undoped GaAlAs;
   said second cladding layer is P-type GaAlAs; and
   said capping layer is n-type GaAs.

5. A semiconductor laser diode according to claim 4, wherein the mole fraction of Al/As in both said first and second cladding layers is 35–55%.

6. A semiconductor laser diode according to claim 4, wherein the mole fraction of Al/As in said active layer is 5–20%.

7. A semiconductor laser diode according to claim 2, wherein said second cladding layer has a thickness of 0.8–2.0 μm; and said capping layer has a thickness of 0.5–5.0 μm.

8. A semiconductor laser diode according to claim 1, wherein said stripe groove has a width of 2–4 μm.

9. A semiconductor laser diode according to claim 1, wherein said stripe groove is separated by 1–3 μm from said channel regions at the point where said channel regions are closest to said mirror edges.

10. A semiconductor laser diode according to claim 1, wherein said channel regions have a depth of 1–4 μm.

11. A semiconductor laser diode comprising:
a semiconductor substrate having mirror edges;
a stripe groove formed in said substrate and running substantially perpendicular to said mirror edges, having end portions and a center portion between said end portions;
channel regions separated from said stripe groove and formed in said substrate adjacent said mirror edges and only at portions of said substrate corresponding to said end portions of said stripe groove;
multiple semiconductor layers including a first cladding layer formed on said substrate, and an active layer formed on said first cladding layer, such that said stripe groove and said channel regions are buried;
wherein said first cladding layer includes a first part adjacent said end portions of said stripe groove having a thickness less than that of a second part adjacent said center portion of said stripe groove, and said active layer includes a first part adjacent said end portions of said stripe groove having a thickness less than that of a second part adjacent said center portion of said strip groove;
further wherein said first part of said first cladding layer has a thickness of 0.3 μm. or less, said second part of said first cladding layer has a thickness of 0.3 μm. or more, said first part of said active layer has a thickness of 0.07 μm or more; and
electrodes formed on a back surface of said substrate and on an uppermost semiconductor layer.

12. A semiconductor laser diode according to claim 11, wherein said second part of said first cladding layer has a thickness of from 0.3 μm to 0.7 μm, and said second part of said active layer has a thickness of from 0.07 μm to 0.1 μm.

13. A semiconductor laser diode comprising:
a semiconductor substrate having mirror edges;
a stripe groove formed in said substrate and running substantially perpendicular to said mirror edges, having end portions and a center portion between end portions;
channel regions separated from said stripe groove and formed in said substrate adjacent said mirror edges in portions of said substrate corresponding to said end portions of said stripe groove and not formed in portions of said substrate corresponding to said center portion of said stripe groove;
multiple semiconductor layers including a first cladding layer formed on said substrate, and an active layer formed on said first cladding layer, such that said stripe groove and said channel regions are buried;
wherein said first cladding layer includes a first part adjacent said end portions of said stripe groove having a thickness less than that of a second part adjacent said center portion of said stripe groove, and said active layer includes a first part adjacent said end portions of said stripe groove having a thickness less than that of a second part adjacent said center portion of said stripe groove;
further wherein the distance between said stripe groove and said channel regions increases from a point at which said channel regions are closest to said mirror edges to a point at which said channel regions are most remote from said mirror edges; and
electrodes formed on a back surface of said substrate and on an uppermost semiconductor layer.

14. A semiconductor laser diode according to claim 13, wherein said semiconductor layers further include:
a second cladding layer formed on said active layer; and
a capping layer formed on said second cladding layer.

15. A semiconductor laser diode according to claim 13, wherein said substrate is at least one of GaAs or GaAlAs.

16. A semiconductor laser diode according to claim 14, wherein said first cladding layer is n-type GaAlAs;
said active layer is undoped GaAlAs;
said second cladding layer is P-type GaAlAs; and
said capping layer is n-type GaAs.

17. A semiconductor laser diode according to claim 16, wherein the mole fraction of Al/As in both said first and second cladding layers is 35–55%.

18. A semiconductor laser diode according to claim 16, wherein the mole fraction of Al/As in said active layer is 5–20%.

19. A semiconductor laser diode according to claim 14, wherein said second cladding layer has a thickness of 0.8–2.0 μm; and
said capping layer has a thickness of 0.5–5.0 μm.

20. A semiconductor laser diode according to claim 13, wherein said stripe groove has a width of 2–4 μm.

21. A semiconductor laser diode according to claim 13, wherein said stripe groove is separated by 1–3 μm from said channel regions at the point where said channel regions are closest to said mirror edges.

22. A semiconductor laser diode according to claim 13, wherein said channel regions have a depth of 1–4 μm.

23. A semiconductor laser diode comprising:
a semiconductor substrate having mirror edges;
a stripe groove formed in said substrate and running substantially perpendicular to said mirror edges, having end portions and a center portion between said end portions;
channel regions separated from said stripe groove and formed in said substrate adjacent said mirror edges in portions of said substrate corresponding to said end portions of said stripe groove and not formed in portions of said substrate corresponding to said center portion of said stripe groove;
multiple semiconductor layers including a first cladding layer formed on said substrate, and an active layer formed on said first cladding layer, such that said stripe groove and said channel regions are buried;
wherein said first cladding layer includes a first part adjacent said end portions of said stripe groove having a thickness less than that of a second part adjacent said center portion of said stripe groove, and said active layer includes a first part adjacent said end portions of said stripe groove having a thickness less than that of a second part adjacent said center portion of said stripe groove;

further wherein said first part of said first cladding layer has a thickness of 0.3 μm or less, said second part of said first cladding layer has a thickness of 0.3 μm or more, said first part of said active layer has a thickness of 0.07 μm or less, and said second part of said active layer has a thickness of 0.07 μm or more; and electrodes formed on a back surface of said substrate and on an uppermost semiconductor layer.

24. A semiconductor laser diode according to claim 23, wherein said second part of said first cladding layer has a thickness of from 0.3 μm to 0.7 μm, and said second part of said active layer has a thickness of from 0.07 μm to 0.1 μm.

* * * * *